United States Patent [19]
Humphreys et al.

[11] Patent Number: 5,805,095
[45] Date of Patent: Sep. 8, 1998

[54] TWO'S COMPLEMENT DIGITAL TO ANALOG CONVERTER

[75] Inventors: Scott Robert Humphreys, Boynton Beach; Raymond Louis Barrett, Jr., Ft. Lauderdale; Lawrence Loren Case, Boynton Beach, all of Fla.

[73] Assignee: Motorola, Inc., Schaumburg, Ill.

[21] Appl. No.: 781,252

[22] Filed: Jan. 10, 1997

[51] Int. Cl.$^6$ .................................................. H03M 1/66
[52] U.S. Cl. ........................................ 341/144; 341/127
[58] Field of Search ....................................... 341/127, 144

[56] References Cited

U.S. PATENT DOCUMENTS

| | | | |
|---|---|---|---|
| 3,924,229 | 12/1975 | Liu | 340/347 DA |
| 4,477,808 | 10/1984 | Ichikawa | 340/825.44 |
| 4,924,223 | 5/1990 | Okamoto | 341/95 |
| 5,296,857 | 3/1994 | Carobolante | 341/144 |
| 5,425,055 | 6/1995 | Blaker | 375/279 |

*Primary Examiner*—Brian K. Young
*Assistant Examiner*—Jason L. W. Kost
*Attorney, Agent, or Firm*—James A. Lamb

[57] ABSTRACT

A two's complement digital to analog converter (300) is for converting a two's complement binary value to an analog output current, and includes a control circuit (310) which generates controlled value bits, a digital to analog current converter (DACC) (320), and an augmenter (330). The DACC (320) generates a DACC analog current which is a portion of the analog output current and which has an absolute value which is related to the binary value of the controlled value bits. The augmenter (330), which is coupled to a most significant bit of the two's complement binary value, generates a portion of the analog output current by modifying the absolute value of the DACC analog current by a least significant bit current increment when the most significant bit indicates a negative value of the two's complement binary value.

16 Claims, 8 Drawing Sheets

TWO'S COMPLEMENT DIGITAL TO ANALOG CONVERTER

FIELD OF THE INVENTION

This invention relates in general to digital to analog converters and in particular to current mode digital to analog converters which are designed to generate a positive or negative current output from a binary, two's complement input.

BACKGROUND OF THE INVENTION

Digital to analog converters (DACs) for producing a positive or negative analog output current from a binary value are used in electronic circuits to provide digital control of an analog output current. In these current mode DACs, a negative value is typically conveyed within the binary value by the two's complement technique, which is well known to one of ordinary skill in the art. In this technique, the most significant bit (MSB) of the binary value indicates whether the value is positive or negative, with an MSB of 0 typically used to indicate a positive value, and an MSB of 1 typically used to indicate a negative value. When a negative value having a decimal absolute value of X is converted to the two's complement value, each bit representative of the absolute value X is inverted and the resultant binary number is incremented by 1 bit (i.e., the least significant bit), and the MSB of the value is set to 1. The bits which are inverted (those except for the MSB bit) are named herein the value bits. For example, in a circuit designed to represent decimal values from −63 to +63 using a seven bit binary value, a −59 decimal value is converted by inverting the value bits for 59, which is (11 1011) to (00 0100), adding 1 bit, resulting in (00 0101), and adding an MSB of 1, resulting in (100 0101).

In order to generate the desired analog value from the two's complement value, typical current mode digital to analog converters include a set of conversion stages which are binary weighted; there are as many stages as there are value bits. The outputs of the stages are added together at an output node. Each binary weighted stage is gated by a bit value. When the two's complement binary value is positive, the conversion to an analog value is straightforward: the value bits of the two's complement value are applied to the set of conversion stages. When the two's complement value is negative, a three step process is typically used: each bit of the value bits is inverted; the value is incremented by a binary 1; and the incremented values are coupled to a set of conversion stages for producing a negative analog output current. This process requires that the DAC include a set of full-adders having as many full-adders as bits in the word. For the example described above, six full adders are required. Each full adder typically comprises between 24 to 32 transistors, depending on the exact standard design chosen. So, in the example, between 144 and 192 transistors are used to perform the incrementing function of the second step. Also, a worst case time delay is added to the conversion based on the case where the decrementing propagates through all seven bits. The number of transistors required and the propagation delay are linearly proportional to the size of the two's complement binary word being converted.

Thus, what is needed is an improved circuit for two's complement conversion in a current mode DAC which reduces the number of transistors and increases the speed of operation.

DETAILED DESCRIPTION OF THE DRAWINGS

Described herein below, is a two's complement digital to analog converter having unique circuitry which is simpler than prior art two's complement digital to analog converters. The two's complement digital to analog converter can briefly be described as using a unique combination of a conventional digital to analog current converter (DACC) and an analog augmenter which modifies the output of the DACC.

As briefly described above, a binary representation typically used in digital logic circuits for a negative number is the well known two's complement representation, in which, when a number is positive, a most significant bit (MSB) of a two's complement word is set to zero and the remaining bits, the value bits of the two's complement word, represent the absolute value of the number. When a negative number is to be represented, the most significant bit is set to one. The generation of the value bits of the two's complement word when the number is negative is algebraically described by:

(1) $-b = b' + 1$

"b" is a set of value bits that represent the absolute value of the number in binary. The minus sign indicates negation, or −1 times the value of the following quantity. The prime indicates an inversion of the bits of the binary number to which it is applied. This is commonly referred to as the one's complement of the binary number. Thus, equation (1) can be read "a negative number having an absolute value represented by the bits b is represented as a two's complement word the value bits of which are generated by performing a binary addition of 1 to the one's complement of the bits b."

Figure 1:
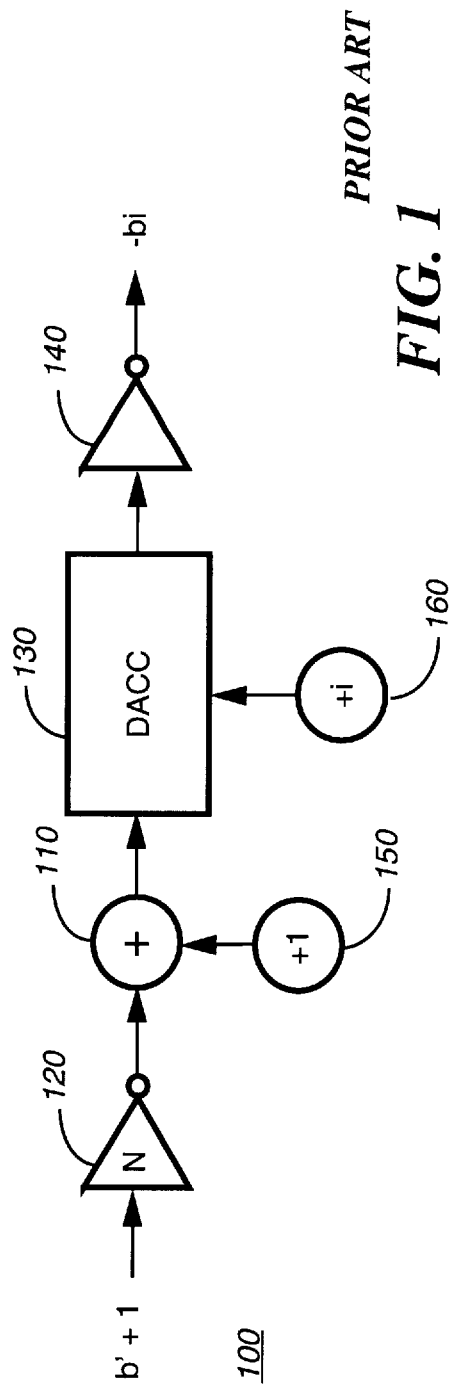
FIG. 1 is an electrical block diagram of a prior art converter circuit which is a portion of a two's complement converter used to generate an analog current output.

Referring to FIG. 1, an electrical block diagram of a prior art converter circuit which is a portion of a two's complement converter used to generate an analog current output is shown. The analog current output has a value proportional to a two's complement word and is negative when the number is negative. The word has N+1 bits. The prior art converter circuit 100 comprises a digital adder 110, a unitary (+1) digital source 150, an N stage digital bit inverter 120, a digital to analog current converter (DACC) 130, a least significant bit current source (+i) 160, and an analog current inverter 140. Two's complement value bits of the word, which are represented in FIG. 1 by b'+1, are coupled as a set of parallel signals to the N stage digital bit inverter 120, which inverts each bit, generating the binary value b−1 which is coupled to an input of the digital adder 110. Also coupled to the digital adder 110 is the unitary (+1) digital source 150. The digital adder digitally adds the +1 to the digital value b−1. The resulting digital value, b, is coupled from the digital adder 110 as a set of parallel signals to the DACC 130. The DACC 130 converts the binary value bits to an analog current which is proportional to the value represented by the bits, b, by a factor that is a least significant bit current increment, which is coupled to the DACC 130 from the least significant bit current source (+i) 160. The resulting analog current, bi, is coupled to, and inverted by, the analog current inverter 140, which generates as an output a negative current, −bi.

The digital adder 110, which is a ripple carry adder, comprises a set of conventional digital logic half-adders having as many half-adders as there are bits in the word. The digital inverter 120 is a set of N conventional digital inverter logic gates. The DACC 130 comprises a set of N binary weighted current mirror stages and is implemented using conventional N channel metal oxide semiconductor (NMOS) current mode circuitry such as current mirrors and current switches, in a manner well known to one of ordinary skill in the art. Each stage is enabled when a corresponding bit of the bits b has a value of 1, and disabled when the corresponding value is 0. The outputs of the binary weighted stages are added together within the DACC 130 to generate the output of the DACC 130, which is a DACC analog current which is proportional to the value of the value bits by a factor which is the least significant bit current increment. The least significant bit current source 160 comprises one transistor which mirrors the least significant bit current increment from a current reference circuit within the same integrated circuit as the converter circuit 100. The analog current inverter 140 comprises a conventional combination of current mode circuitry for mirroring and inverting an analog current. The digital adder 110 could alternatively be implemented using other conventional logic arrangements, which are faster than the ripple carry adder, but which have more transistors. Furthermore, the converter circuit 100 implemented using any known prior art digital half adder 110 will accomplish the two's complement conversion more slowly than the two's complement conversion current performed by the converter circuits 200, 300, 400, 500 in accordance with the preferred and alternative embodiments of the present invention described herein.

In this prior art converter circuit 100, a positive output current of the current elements (the DACC 130, the least significant bit current source 160, and the analog current inverter 140) is a current which is sunk to a ground reference by a current element, and a negative current is one which is sourced from a current element (and therefore sunk by a current element to which the output of the current element is coupled).

It will be further appreciated that although the digital portion of these functions can also be accomplished by a microprocessor, the two's complement word is typically made available from an integrated circuit which generates a two's complement word, and the microprocessor would then have to be interjected between the integrated circuit and the DACC 130. This would result in a very complex and slow implementation of the two's complement converter.

Figure 2:
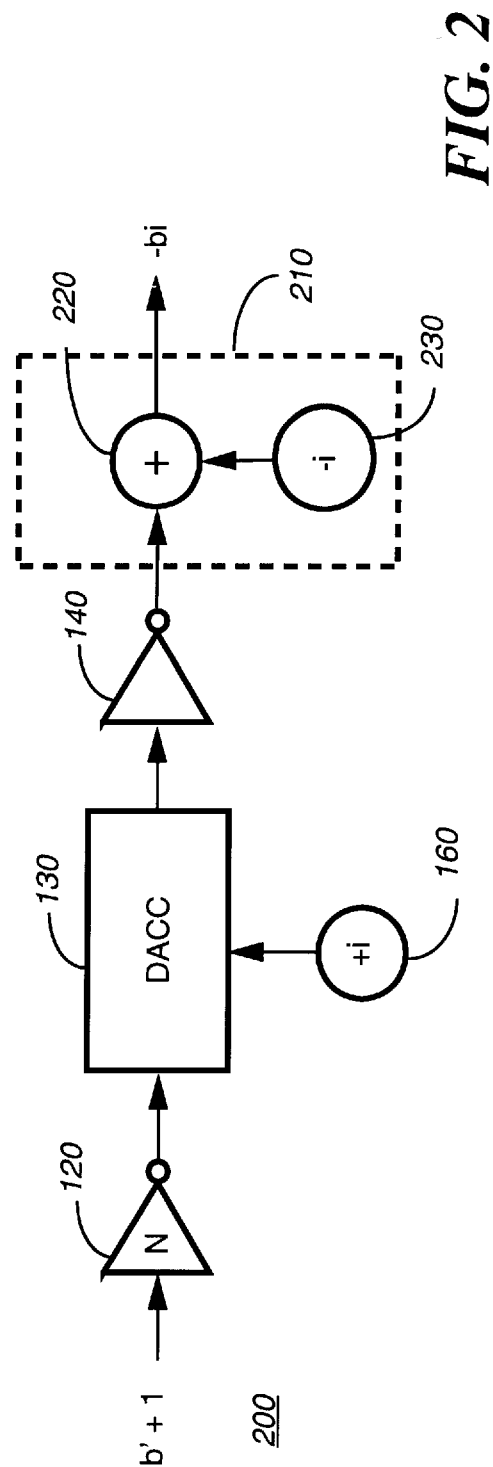
FIG. 2 is an electrical block diagram of a converter circuit which is a portion of a two's complement converter used to generate an analog current output, in accordance with the preferred and alternative embodiments of the present invention.

Referring to FIG. 2, an electrical block diagram of a converter circuit which is a portion of a two's complement converter used to generate an analog current output is shown, in accordance with the preferred and alternative embodiments of the present invention. The analog current output has a value proportional to a two's complement word and a negative sign when the number is negative. The converter circuit 200 comprises the N stage digital bit inverter 120, the digital to analog current converter (DACC) 130, the least significant bit current source (+i) 160, the analog current inverter 140, and an augmenter 210. The augmenter 210 comprises an analog current adder 220 and a negative least significant bit current source (−i) 230. Two's complement value bits of the word, which are represented in FIG. 2 by b'+1, are coupled as a set of parallel signals to an input of the N stage digital bit inverter 120, which inverts each bit, generating the binary value (b'+1)', which can be represented alternatively as b−1. The value b−1 is coupled as a set of parallel signals to the DACC 130. The DACC 130 converts the binary value bits to an analog current which is proportional to the value represented by the bits, b−1, by a factor that is the least significant bit current source (+i), which is also coupled to the DACC 130. The resulting analog current (b−1)i is coupled to, and inverted by, the analog current inverter 140, which generates as an output a negative current, −(b−1)i, proportional to the value represented by the value bits of the two's complement number. The negative current, −(b−1)i, is coupled to the analog current adder 220, which adds the negative current, −(b−1)i, to a negative least significant bit current coupled to the analog current adder 220 from the negative least significant bit current source (−i) 230. The output of the analog current adder 220 is the desired negative output current, −bi. The DACC 130 is preferably implemented using conventional combinations of current mode circuitry, such as current mirrors and switches. The negative least significant bit current source 230 comprises two transistors conventionally coupled to mirror and invert a least significant bit current reference within the same integrated circuit.

It will be appreciated that the sign of the current could be reversed in converter circuits 100, 200 which are designed complementary to those described above. In such complementary circuits, the DACC 130 would typically be a P channel metal oxide semiconductor (PMOS) transistor circuit. It will be further appreciated that the converter circuits 100, 200 could be implemented in technology other than metal oxide semiconductor (MOS), such as bipolar semiconductor.

Figure 3:
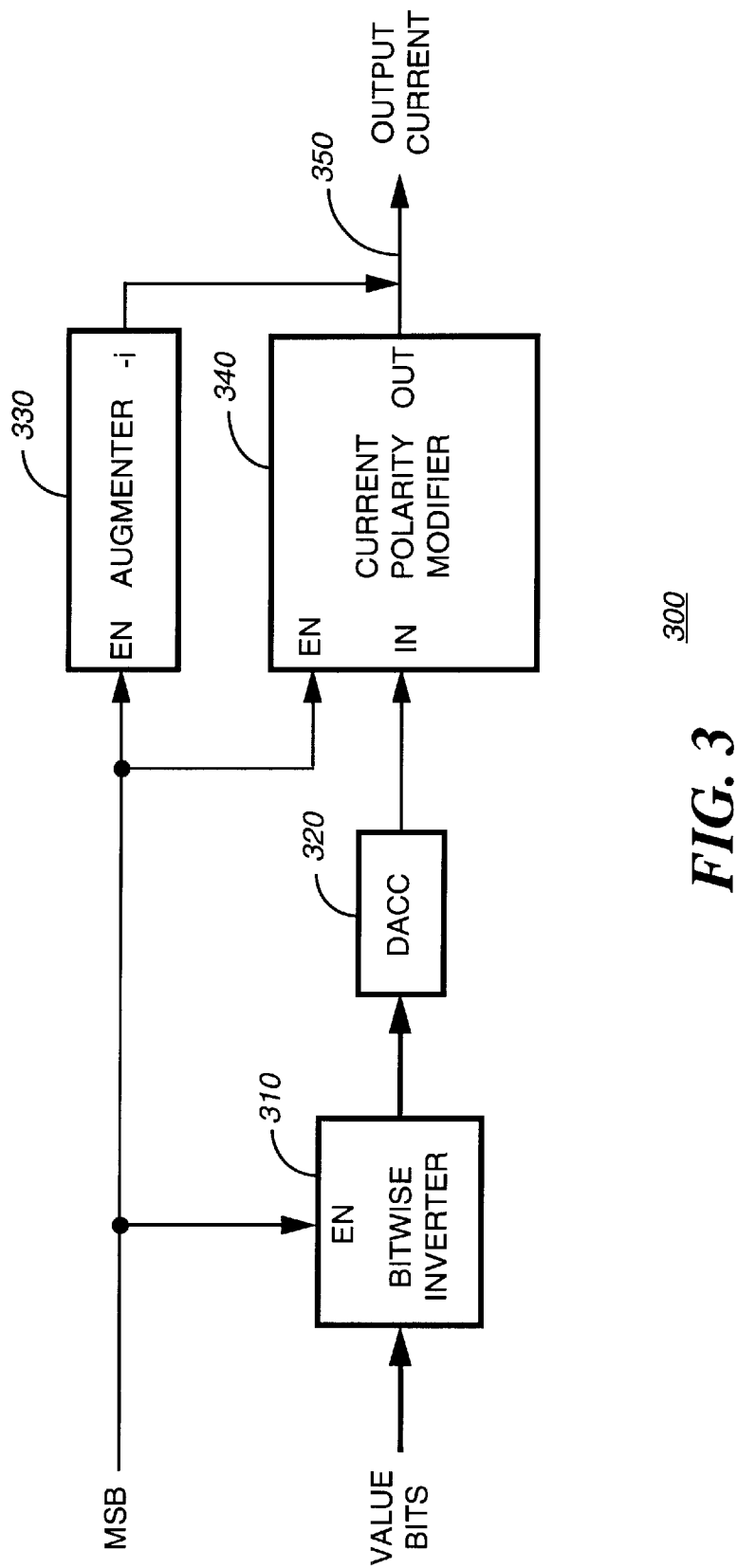
FIG. 3 is a high level electrical block diagram of a two's complement digital to analog converter (TCDAC), in accordance with the preferred and alternative embodiments of the present invention.

It will be appreciated that the use of the augmenter 210 implemented with analog circuitry instead of the digital adder 110 simplifies and speeds up the operation of the converter circuit 200. Referring to FIG. 3, a high level electrical block diagram of a two's complement digital to analog converter (TCDAC) is shown, in accordance with the preferred and alternative embodiments of the present invention. The two's complement digital to analog converter (TCDAC) 300 converts a two's complement positive binary number as well as negative binary number represented by a binary word having N+1 bits to an analog output current having an absolute value proportional to the value of the number and a sign (direction) according to the sign of the number. The TCDAC 300 comprises a bitwise inverter 310, a DACC 320, an augmenter 330, and a current polarity modifier 340. A two's complement number which includes a most significant bit signal (MSB), which is a digital logic signal, and a set of value bits, b, which is a set of digital logic signals, are inputs to the TCDAC 300. The value bits are a direct representation of the value of the number when the number is positive, and are determined, as described above, by b'+1 when the number is negative. The MSB is 0 when the number is positive and is 1 when the number is negative.

The value bits are coupled to a parallel input of the bitwise inverter 310 and the MSB signal is coupled to an enable input (EN) of the bitwise inverter 310. When the MSB signal is 0, the bitwise inverter 310 couples the value bits, b, without modification to the DACC 320, which generates a DACC analog current having a value bi. When the MSB signal is 1, the bitwise inverter 310 inverts each bit and couples the resulting bits, (b−1), to the DACC 320, which generates the DACC analog current having a value (b−1)i.

The DACC analog current is coupled to an analog input (IN) of the current polarity modifier 340. The MSB signal is coupled to an enable input of the current polarity modifier 340. When the MSB signal is 0, the current polarity modifier 340 generates a current of the TCDAC 300 at an output (OUT) which is essentially equal to the DACC analog current, and which is the output current of the TCDAC 300. When the MSB signal is 1, the current polarity modifier 340 generates a portion of the output current of the TCDAC 300, −(b−1)i, which is essentially equal in value to the DACC analog current, and inverted in polarity. The MSB signal is also coupled to an enable (EN) input of the augmenter 330. When the MSB signal is 0, the augmenter is disabled and generates no output. When the MSB signal is 1, the augmenter generates an analog current at an output (−i) which is essentially equal to −i, and which is coupled to the output (OUT) of the current polarity modifier 340 at node 350. Thus, when the MSB signal is 1, the total output current at the node is −bi.

The DACC 320, the augmenter 330, and the current polarity modifier 340, which are uniquely combined in accordance with the preferred and alternative embodiments of the present invention, are each implemented using combinations of conventional current mode circuitry. A variety of specific implementations of the TCDAC 300 are possible, all of which share the characteristic of having an equivalent of the DACC 320 and the augmenter 330. Three implementations are described herein, below.

Figure 4:
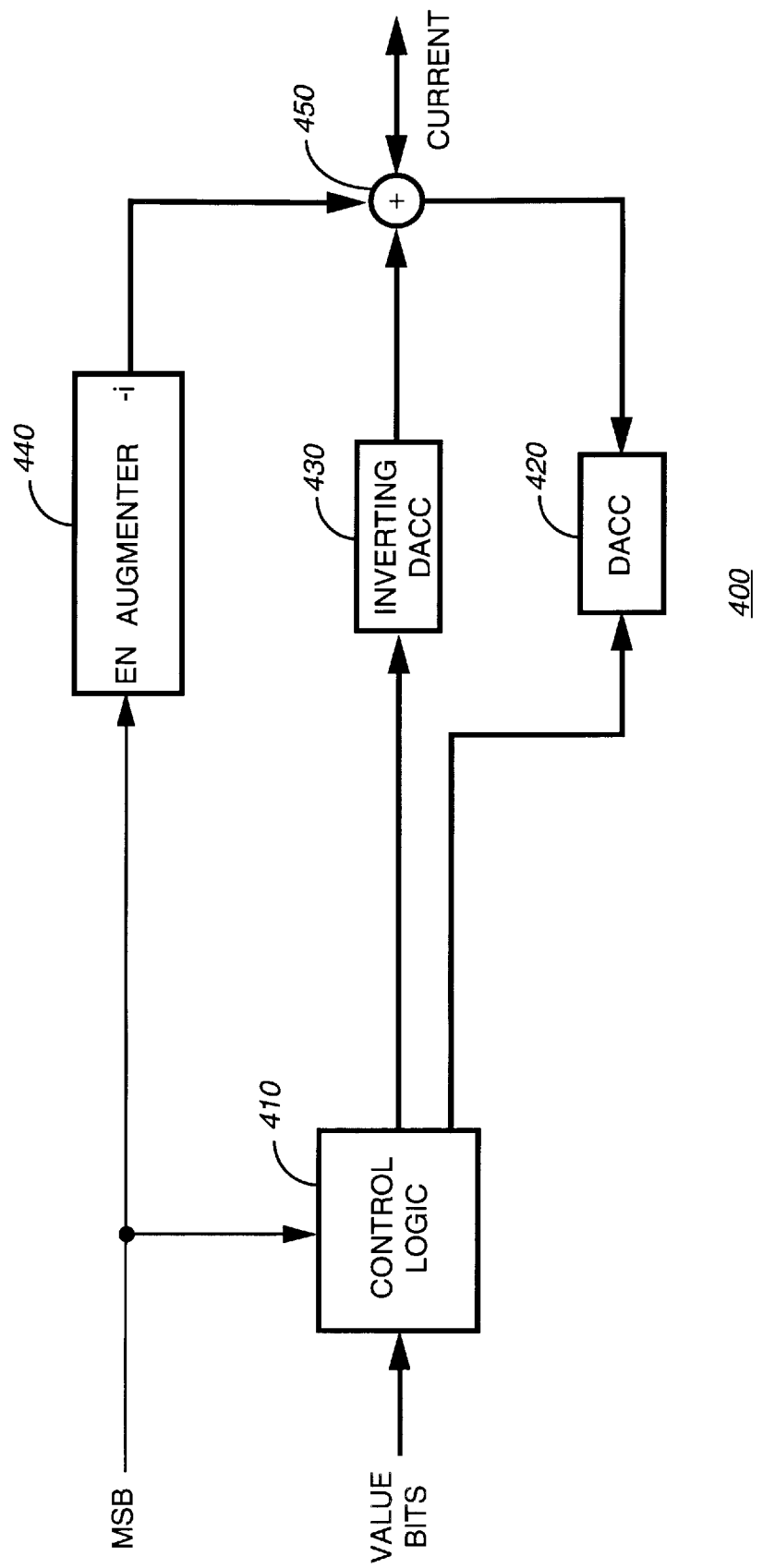
FIG. 4 is an electrical block diagram of a two's complement digital to analog converter (TCDAC) 400, in accordance with the preferred embodiment of the present invention.

Referring to FIG. 4, an electrical block diagram of a two's complement digital to analog converter (TCDAC) 400 is shown, in accordance with the preferred embodiment of the present invention. The TCDAC 400 comprises a control logic circuit 410, a non-inverting DACC 420, an inverting DACC 430, an augmenter 440, and a current summer 450. The TCDAC 400 converts a two's complement word having N+1 bits to a proportional analog current. The N value bits are coupled to a parallel input of the control logic circuit 410 and the MSB signal is coupled to an enable input (EN) of the control logic circuit 410. When the MSB signal is 0, the control logic circuit 410 couples the N value bits, b, without modification to the non-inverting DACC 420, which sinks a DACC analog current having a positive value, bi (hence, the direction of the output current of the non-inverting DACC 420 is illustrated in FIG. 4 as flowing into the non-inverting DACC 420; a positive current). Also, when the MSB signal is 0, the control logic circuit 410 couples a set of N 1's to the inverting DACC 430, in response to which the DACC 430 generates essentially no DACC output current. Furthermore, when the MSB signal is 0, the augmenter is disabled, and generates essentially no augmenter current at the output (−i) of the augmenter 440. The current summer 450, which comprises simply a single electrical node to which the output of the non-inverting DACC 420 (a positive DACC analog current), the inverting DACC 430 (a negative DACC analog current), and the augmenter 440 are coupled, therefore carries an output current having a value of bi when the MSB signal is 0.

When the MSB signal is 1, the control logic circuit 410 couples the N value bits, b, without modification to the inverting DACC 430, which sources an inverting DACC analog current having a negative value, −(b−1)i. Also, when the MSB signal is 1, the control logic circuit 410 couples a set of N 0's to the non-inverting DACC 420, in response to which the non-inverting DACC 420 generates essentially no DACC output current. Furthermore, when the MSB signal is 1, the augmenter 440 is enabled, and generates a negative augmenter current, −i, at the output (−i), having a value of one least significant bit. The current summer 450 therefore carries an output current having a value of −bi when the MSB signal is 1. It will be appreciated that the inverting DACC 430 generates the DACC analog current having a negative value which is proportional to a bitwise inversion of the controlled value bits, whether the MSB signal indicates a negative value or positive value, and that the non-inverting DACC 420 generates the DACC analog current having a positive value which is proportional to the positive value bits, whether the MSB signal indicates a negative value or positive value.

The control logic 410 comprises a simple set of conventional voltage mode digital logic gates intercoupled in a manner well known to one of ordinary skill in the art to produce the functions described herein. The set of conventional voltage mode digital logic gates consists essentially of a set of N OR gates, a set of N AND gates, and one INVERTER gate. The non-inverting DACC 420 is preferably equivalent to the DACC 130. The inverting DACC 430 is preferably a PMOS DACC, which has a characteristic of generating a source (negative) current in proportion to an inversion of the bits values coupled to the parallel input. The inverting DACC 430 is preferably implemented using a conventional combination of current mode circuitry such as current mirrors and current switches, in a manner well known to one of ordinary skill in the art. It will be appreciated that the enablement function provided by the bitwise inverter 310 (FIG. 3) is performed by the control logic circuit 410 and that the inversion function provided by the bitwise inverter 310 (FIG. 3), the digital to analog conversion function provided by the DACC 320 (FIG. 3), and the current inversion function provided by the current polarity modifier are performed by the inverting DACC 430. The augmenter 440 preferably consists essentially of a least significant bit current source and an enablement switch, and is preferably implemented using conventional current mode circuitry, in a manner well known to one of ordinary skill in the art.

Figure 5:
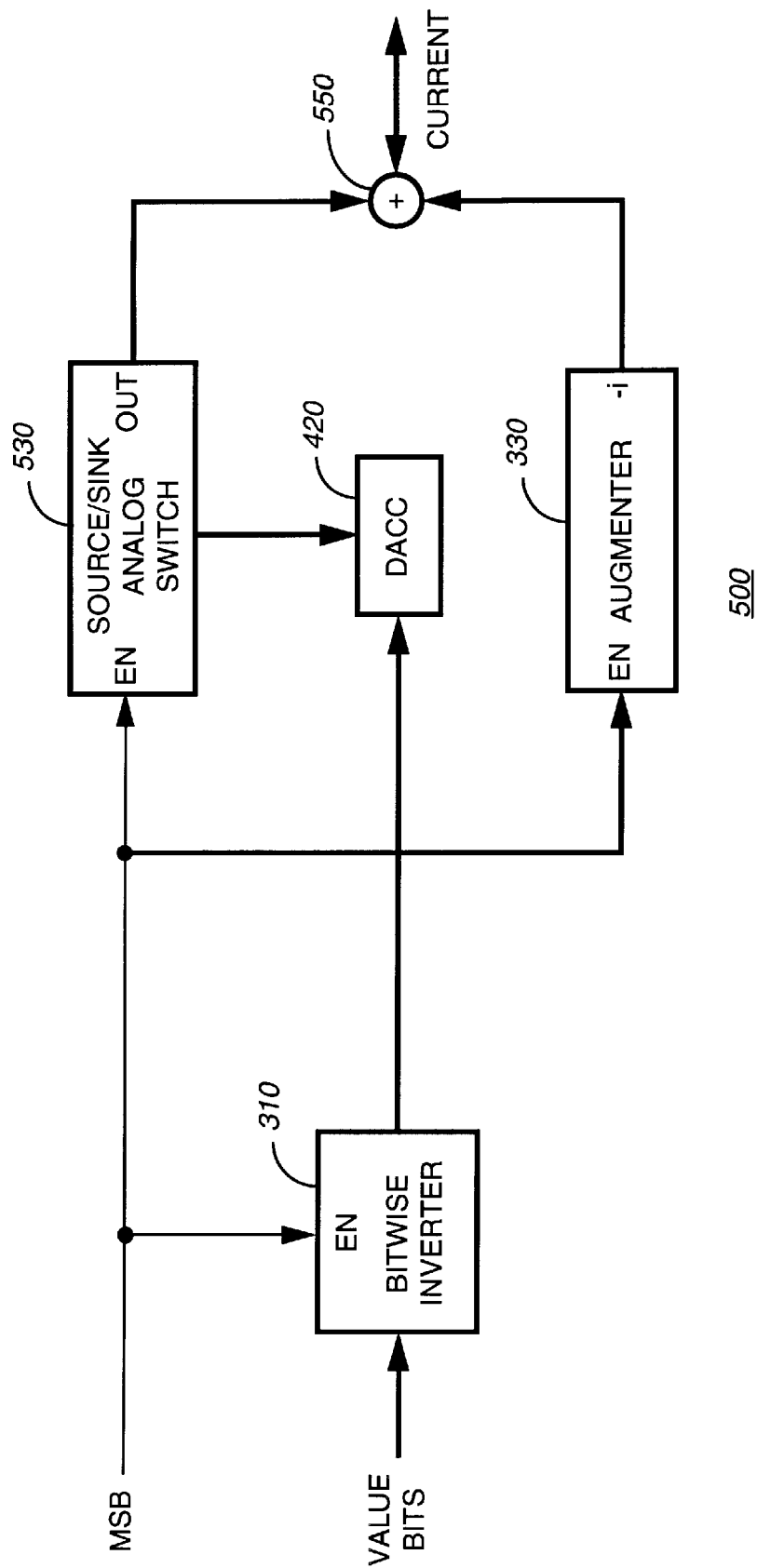
FIG. 5 is an electrical block diagram of a two's complement digital to analog converter (TCDAC) 500, in accordance with a first alternative embodiment of the present invention.

Referring to FIG. 5, an electrical block diagram of a two's complement digital to analog converter (TCDAC) 500 is shown, in accordance with a first alternative embodiment of the present invention. The TCDAC 500 comprises the bitwise inverter 310 (FIG. 3), the non-inverting DACC 420 (FIG. 4), a source/sink analog switch 530, and the augmenter 330 (FIG. 3), and a current summer 550. The TCDAC converts a two's complement word having N+1 bits to a proportional analog output current. The bitwise inverter 310, the non-inverting DACC 420, the source/sink analog switch 530, and the augmenter 330 are intercoupled to each other, to the two's complement value bits, and to the MSB signal, respectively, the same as the bitwise inverter 310, DACC 320, augmenter 330, and current polarity modifier 340 described with reference to FIG. 3. The bitwise inverter 310, the non-inverting DACC 420, the source/sink analog switch 530, and the augmenter 330 perform, respectively, the same functions as the bitwise inverter 310, DACC 320, augmenter 330, and current polarity modifier 340. The bitwise inverter comprises conventional digital logic essentially consisting of a set N AND gates, N OR gates, and an INVERTER. The summer 550 is simply an electrical node. The source/sink analog switch performs the same functions as the current polarity modifier 340 of FIG. 3. It is described in more detail below.

Figure 6:
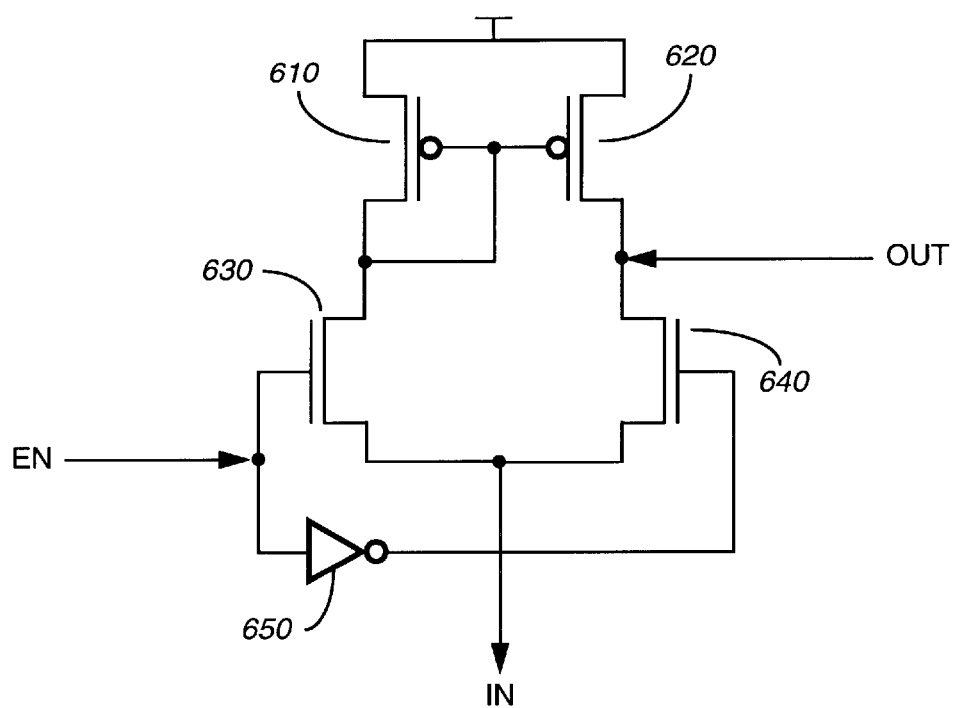
FIG. 6 is a an electrical circuit diagram of the source/sink analog switch 530, in accordance with the first alternative embodiment of the present invention.

Referring to FIG. 6, an electrical circuit diagram of the source/sink analog switch 530 is shown, in accordance with the first alternative embodiment of the present invention. The source/sink analog switch 530 comprises PMOS current mirror transistors 610, 620 coupled in a conventional manner to NMOS current switch transistors 630, 640. The MSB signal is coupled to the gate of the switch transistor 630 and through a logic (voltage) inverter 650 to the gate of switch transistor 640. When the MSB signal is 0, the switch transistor 630 is turned off, the switch transistor 640 is turned on, and the sink current coupled to the non-inverting DACC 420 is coupled to the summer 550 as a sink current. When the MSB signal is 1, the switch transistor 640 is turned off, the switch transistor 630 is turned on, and the sink current coupled to the non-inverting DACC 420 is mirrored through the current mirror transistors 610, 620 and coupled to the output (OUT), thence to the summer 550, as a source current essentially equal in value to the sink current at the input (IN).

Figure 7:
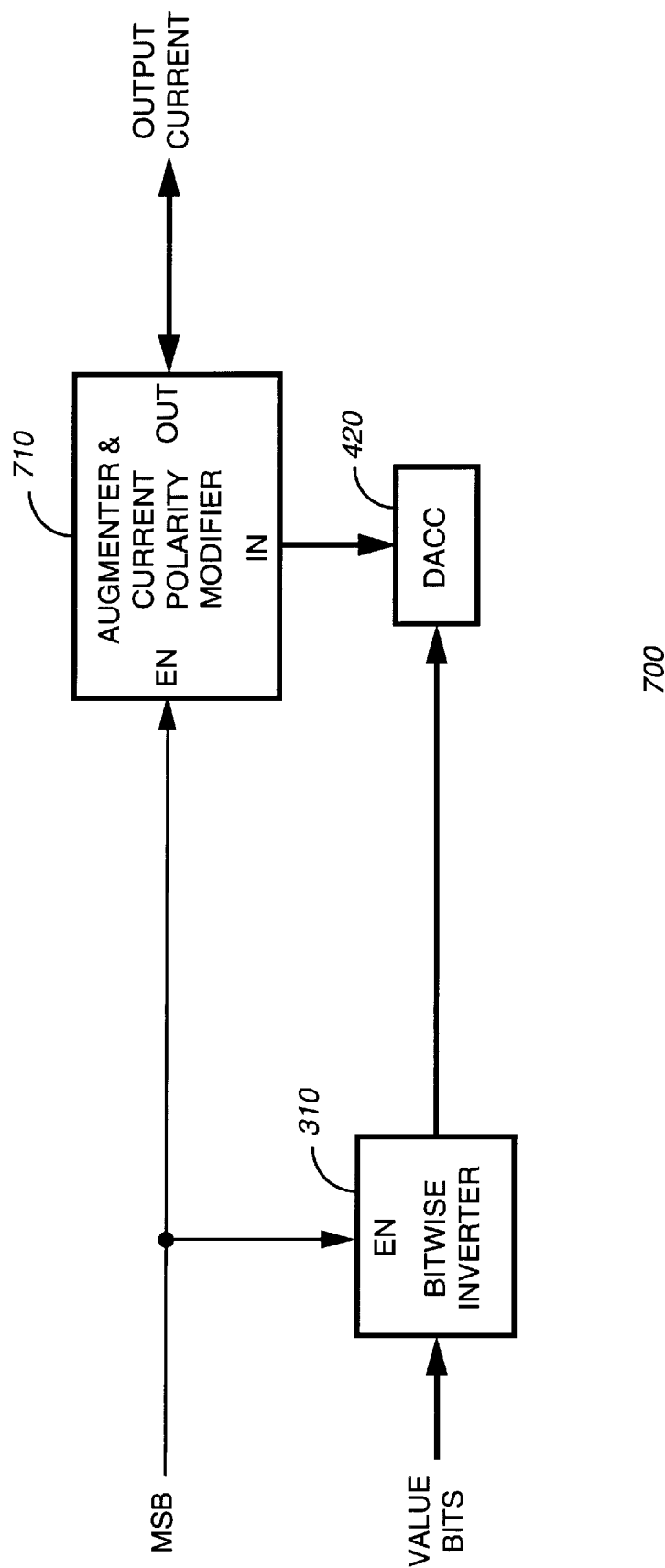
FIG. 7 is an electrical block diagram of a two's complement digital to analog converter (TCDAC) 700, in accordance with a second alternative embodiment of the present invention.

Referring to FIG. 7, an electrical block diagram of a two's complement digital to analog converter (TCDAC) 700 is shown, in accordance with a second alternative embodiment of the present invention. The TCDAC 700 comprises the bitwise inverter 310 (FIG. 3), the non-inverting DACC 420 (FIG. 4), and an augmenter and current polarity modifier 710. The TCDAC 700 converts a two's complement word having N+1 bits to a proportional analog output current for which a source current represents a positive number and a sink current represents a negative number. The N value bits are coupled to a parallel input of the bitwise inverter 310 and the MSB signal is coupled to an enable input (EN) of the bitwise inverter 310. When the MSB signal is 0, the bitwise inverter 310 couples the value bits, b, without modification, to the non-inverting DACC 420, which generates a DACC analog current having a value bi. When the MSB signal is 1, the bitwise inverter 310 inverts each bit and couples the resulting bits, (b−1), to the non-inverting DACC 420, which generates the DACC analog current having a value (b−1)i.

The DACC analog current is coupled to an analog input (IN) of the augmenter and current polarity modifier 710. The MSB signal is coupled to an enable input (EN) of the augmenter and current polarity modifier 710. When the MSB signal is 0, the augmenter and current polarity modifier 710 generates a source current at an output (OUT) which is essentially equal to the DACC analog current, and which is the output current of the TCDAC 700. When the MSB signal is 1, the augmenter and current polarity modifier 710 generates the output current of the TCDAC 700 to be a sink current essentially equal to −bi.

Figure 8:
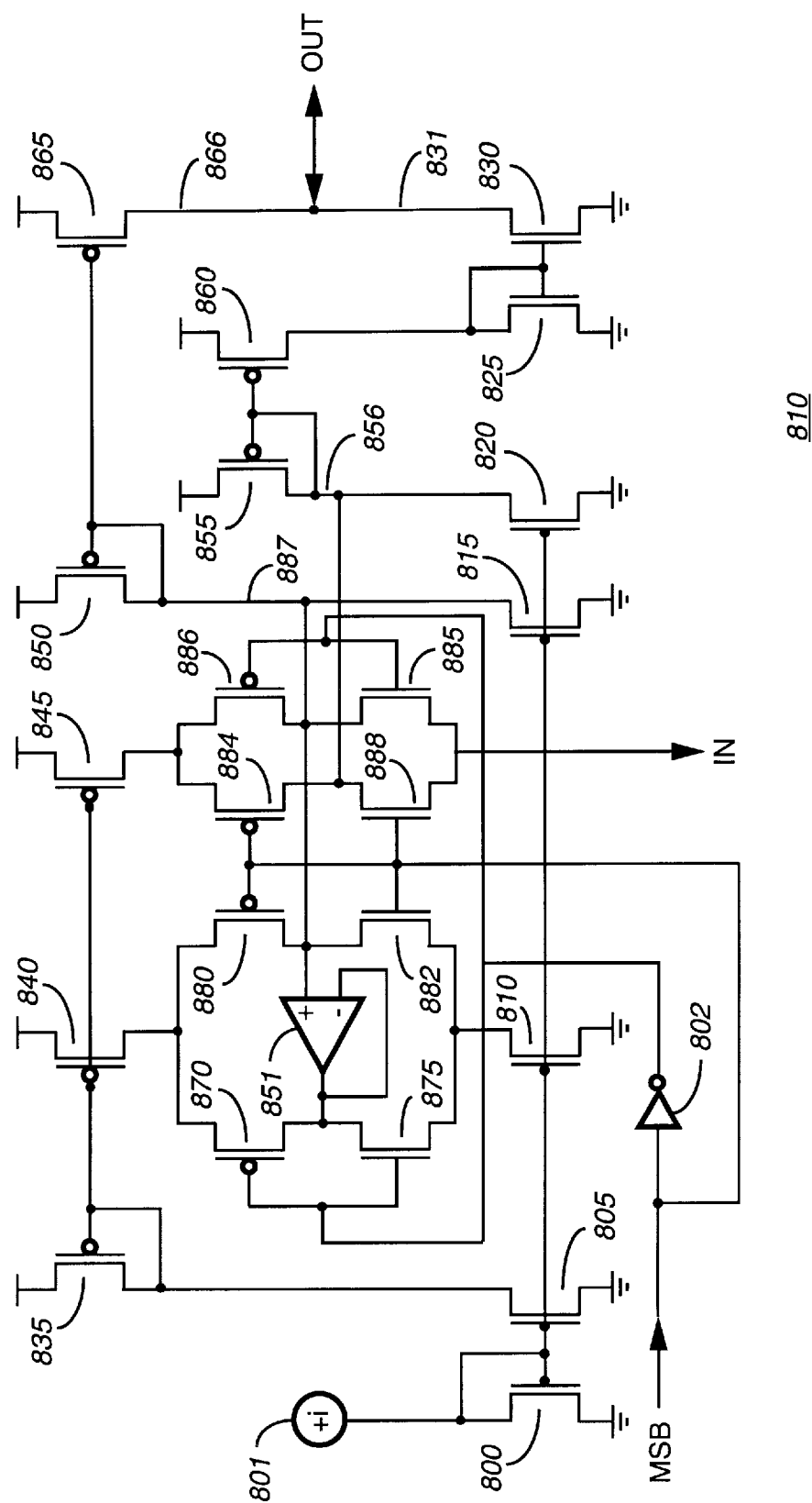
FIG. 8 is a an electrical circuit diagram of the augmenter and current polarity modifier 710, in accordance with the second alternative embodiment of the present invention.

Referring to FIG. 8, an electrical circuit diagram of the augmenter and current polarity modifier 710 is shown, in accordance with the second alternative embodiment of the present invention. The augmenter and current polarity modifier 710 comprises a least significant bit current source (+i) 801, inverter 802, N channel metal oxide semiconductor (NMOS) transistors 800, 805, 810, 815, 820, 825, 830, 875, 882, 885, 888, P channel metal oxide semiconductor (PMOS) transistors 835, 840, 845, 850, 855, 860, 865, 870, 880, 884, 886, and amplifier 851. The augmenter and current polarity modifier 710 utilizes the well known current mirror sub-circuit comprising pairs of NMOS and PMOS transistors and the differential amplifier 851 to generate a high performance analog output current at the output (OUT) which allows the MSB signal coupled to the MSB input (MSB) to determine the analog output current direction and also augments the analog output current by a current increment proportional to one least significant bit (LSB) when the MSB signal indicates a negative result, thereby performing the requisite augmentation for two's complement arithmetic. Internal current signals are superimposed for biasing so that the response time does not degrade, but are canceled at the output summation node.

Key to the operation are the two internal current summation nodes 887, 856. Node 887, through its connection to PMOS transistor current mirror 850, 865 acts as a summing node for currents which pull up the output through branch 866, while node 856 through its PMOS transistor current mirror 855, 860 and subsequent NMOS transistor current mirror 825, 830 acts as a summing node for currents which pull down the output through branch 831. At the analog output current node, which is the junction of branches 866 and 831, the resulting analog output current is positive whenever the magnitude of the current through branch 866 exceeds the magnitude of the current through branch 831, and equal to the magnitude of the difference. Likewise, the resulting analog output current is negative whenever the magnitude of the current through branch 831 exceeds the magnitude of the current through branch 866, and equal to the magnitude of the difference.

Over the entire range of currents, the augmenter and current polarity modifier 710 assures that neither the current through branch 866 nor the current through branch 831 is ever zero, regardless whether the resulting difference, and hence output, is zero, thereby ensuring that all of the output devices remain biased in their active regions, with the consequence that the magnitude of the gate to source voltage of PMOS transistors 850 and 855 is always near, or in excess of the threshold voltage, and therefore never requiring that voltage to recover from an off condition.

To ensure that the outputs remain biased active, NMOS transistors 815, 820, are each biased to provide a current magnitude equivalent to 3 times 1 LSB, and are utilized symmetrically to bias nodes 887 and 856.

Two unequally biased PMOS differential switches, 870, 880 and 884, 886 and two unequally biased NMOS differential switches, 875, 882 and 888, 885 are constructed and mutually controlled by the MSB signal to combine their currents at the summing nodes 887 and 856, thereby determining the output current.

A current, equal to one least significant bit (LSB) is supplied by the least significant bit current source 801 at the current mirror input diode connection of NMOS transistor 800. NMOS transistor 810, which is mirror coupled to NMOS transistor 800, biases the NMOS differential switch 875, 882 at one LSB. Bias device NMOS 805, which is also mirror coupled to NMOS transistor 800, mirrors the one LSB current which is carried to the diode connected PMOS mirror input 835 to be replicated by PMOS mirror transistors 840, 845, which respectively bias the PMOS differential switches 870, 880 and 884, 186 at two times one LSB.

The DACC analog current from the non-inverting DACC 420 is utilized to bias NMOS differential switch 888, 885 in magnitudes essentially equal to integer multiples of the one LSB current magnitude. The MSB input of the augmenter and current polarity modifier 710 is coupled to an input of inverter 802, which generates an inverted MSB signal at its output.

Whenever the MSB signal is 0 corresponding to a positive value of the two's complement number, the NMOS differential switch 885, 888 has transistor 885 ON and 888 OFF and directs the DACC analog current from the non-inverting DACC 420 to node 887, resulting in a contribution to the current through branch 866 equal to the integer multiple of the LSB, bi, as determined by the non-inverting DACC 420. Simultaneously, due to the same MSB signal condition, PMOS transistor 880 is ON, diverting two times one LSB away from the output mirrors at that same node.

The resultant excitation at node 887 when the MSB signal is 0 is: the DACC analog current, bi, plus three times one LSB through transistor 815 minus two times one LSB through transistor 880; with the total result of a pull up through branch 866 of DACC analog current plus one LSB, a signal which is never zero.

Simultaneously, when the MSB signal is 0, PMOS transistor 884 is also ON, diverting two times one LSB away from the output mirrors at node 856. The resultant excitation at node 856 when the MSB signal is 0 is: three times one LSB through transistor 820 minus the two times one LSB through transistor 884; with a total result of a pull down through branch 831 of one LSB, another signal which is never zero.

The resultant analog output current when the MSB signal is 0 is the difference of the currents between the pull up through branch 866 of DACC analog current plus one LSB minus the pull down through branch 831 of one LSB, resulting in an pull up (positive) analog output current equal to the DACC analog current magnitude, bi.

A different set of conditions exist when the MSB signal is 1, corresponding to a negative number. In this instance, the NMOS differential switch 885, 888 has transistor 888 ON and 885 OFF and directs the DACC analog current coupled from the non-inverting DACC 420 to node 856, resulting in a contribution to the current through branch 831 equal to the DACC analog current. PMOS transistor 884 is OFF, so no current is diverted from the bias, and the resultant pull down through branch 831 is: the DACC analog current plus three times one LSB through transistor 820, which is never zero.

Simultaneously, whenever the MSB signal is a logic condition 1, NMOS transistor 882 is ON, which adds one LSB to the current magnitude at node 887, but PMOS transistor 886 also is ON, diverting two times one LSB from the current magnitude at node 887; with a total result of a pull up through branch 866 of two times LSB, which is never zero.

The resultant analog output current when the MSB signal is 1 is the difference of the currents between the pull up through branch 866 of two times one LSB minus the pull down through branch 831 of DACC analog current plus three times one LSB, resulting in a pull down (negative) analog output current essentially equal in magnitude to the DACC analog current, (b−1)i, plus one LSB, correctly augmenting the DACC analog current to generate a total analog output current of −bi.

Due to the differential nature of the current switches, the unequal currents in PMOS transistor 870 and NMOS transistor 875, as well as the fact that PMOS transistor 870 and NMOS transistor 875 are not ON at the same time, the currents through those devices are absorbed into the active output of amplifier 851. To ensure that the bias voltage is appropriate to absorb a current from the switches, the amplifier 851 is connected as a voltage follower to node 887 which is that branch which is absorbing the current from the summations and, as described above, is always active.

The bitwise inverter 310 and the control logic circuit 410 described with source to FIGS. 3, 4, and 5 are alternatively described as control circuits, and the bits coupled from the control circuits 310, 410 to the DACCs 320, 430 as described with reference to FIGS. 3, 4 and 5 are controlled value bits. The bits coupled from the control circuit 410 to the non-inverting DACC 420 as described with reference to FIG. 4 are positive value bits.

The two's complement digital to analog converters described above in accordance with the preferred and alternative embodiments of the present invention can be summarized as being two's complement digital to analog converters for converting a two's complement binary value to an analog output current, wherein the two's complement binary value has a most significant bit (MSB) and a set of value bits, and which includes a control circuit, a digital to analog current converter (DACC), and an augmenter.

The control circuit is coupled to the set of value bits and generates controlled value bits having a binary value. The digital to analog current converter (DACC) is coupled to the control circuit and generates a DACC analog current which is a portion of the analog output current and which has an absolute value which is related to the binary value of the controlled value bits. The augmenter is coupled to the sign bit and to the DACC and generates a portion of the analog output current by modifying the absolute value of the DACC analog current by a least significant bit (LSB) current increment when the MSB indicates a negative value.

Figure 9:
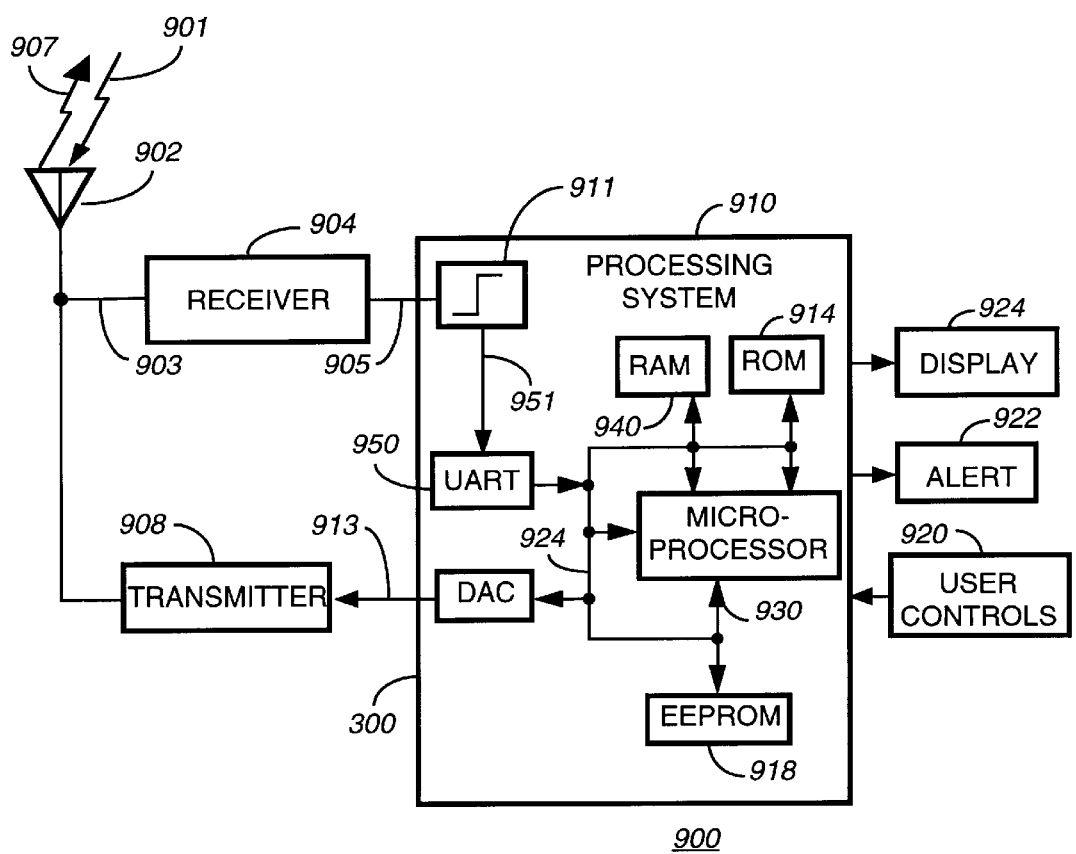
FIG. 9 is an electrical block diagram of a radio 900, in accordance with the preferred and alternative embodiments of the present invention.

Referring to FIG. 9, an electrical block diagram of a radio 900 is shown, in accordance with the preferred and alternative embodiments of the present invention. The radio 900 is a selective call radio which includes an antenna 902 for intercepting and transmitting a radiated signal 901. The antenna 902 converts the radiated signal 901 to a conducted radio signal 903 which is coupled to a conventional receiver 904 wherein the conducted radio signal 903 is received in a conventional manner. Receiving includes filtering to remove undesirable energy at off channel frequencies, amplification of the filtered signal, frequency conversion of the conducted radio signal 903, and demodulation of the conducted radio signal 903 in a conventional manner. The receiver 904 generates a demodulated signal 905 that is coupled to a processing section 910. The processing section 910 is coupled to a display 924, an alert 922, a transmitter 908 and a set of user controls 920.

The processing section 910 comprises a microprocessor 930 that is coupled to a universal asynchronous receiver transmitter (UART) 950, a random access memory (RAM) 940, a read only memory (ROM) 914, the unique two's complement digital to analog converter (TCDAC) 300 described herein above, and an electrically erasable programmable read only memory (EEPROM) 918. The processing section 910 is coupled to the transmitter by the TCDAC 300. The processing section 910 further comprises a signal squaring circuit 911 that is coupled to the demodulated signal 905 and the UART 950. The signal squaring circuit 911 is a conventional signal shaping circuit that generates data symbols, preferably binary symbols, from the demodulated signal 905, which are coupled to the UART 950, wherein they are converted to parallel data words and coupled to the microprocessor 930 by the parallel logic bus 924.

A message processor function decodes outbound words and processes an outbound message when an address received in the address field of the outbound signaling protocol matches an embedded address stored in the EEPROM 918, in a manner well known to one of ordinary skill in the art for a selective call radio 900. An outbound message that has been determined to be for the selective call radio 900 by the address matching is processed by the message processor function according to the contents of the outbound message and according to modes set by manipulation of the set of user controls 920, in a conventional manner. An alert signal is typically generated when an outbound message includes user information. The alert signal is coupled to the alert device 922, which is typically either an audible or a silent alerting device.

When the outbound message includes alphanumeric or graphic information, the information is displayed on the display 924 in a conventional manner by a display function at a time determined by manipulation of the set of user controls 920.

Inbound messages are generated in digital form by a inbound message function, typically in response to user manipulation of the set of controls 920 or an event detected by the processing section 910, such as receipt of an outbound message or occurrence of a predetermined time of day, in a conventional manner. A digitized version of the analog signal which is to be used to modulate the transmitter 908 is generated as a sequence of two's complement words which are coupled to the TCDAC 300, wherein they are converted to an analog current which modulates the transmitter 908. The conventional transmitter 908 generates an RF signal, which is transmitted by the antenna 902.

The EEPROM 918, RAM 940, the ROM 914, and the UART 950 are preferably conventional parts. The ROM 914 has a conventional set of masked program instructions. Preferably, the microprocessor 930 is similar to a conventional processor of the 68HC11 family manufactured by Motorola, Inc. It will be appreciated that other processors can be modified for use as the microprocessor 930, and that additional processors of the same or alternate type can be added as required to handle the processing requirements of the processing section 910. It will be appreciated that other types of memory, e.g., ultraviolet erasable programmable read only memory (UVEPROM) or flash ROM, can be alternatively utilized for the ROM 914, as well as the RAM 940. It will be further appreciated that the RAM 940, the EEPROM 918 and the ROM 914, singly or in combination, can be integrated as a contiguous portion of the microprocessor 930.

It will be further appreciated that the processing section 910 can be alternatively implemented without the microprocessor 930, by implementing the conventional functions described herein with a combination of conventionally available off the shelf integrated circuits such as CMOS shift registers, clocks, gates, counters, ADC, and RAM, and that further, some or all of the conventionally available off the shelf integrated circuits used to implement the processing system can be alternatively implemented in an application specific integrated circuit.

It will be further appreciated that the TCDAC 300 can be alternatively or additionally used within the radio 900 wherever a two's complement digital to analog conversion is used, for example, generating an analog frequency control signal (not shown in FIG. 9) by another TCDAC 300 within the processing section 910 which coupled to the receiver 904 from a two's complement value generated by the microprocessor 930.

By now it should be appreciated that there has been described an improved two's complement digital to analog converter which, by virtue of making an analog augmentation instead of a digital adjustment (addition), is simpler and faster than prior art two's complement digital to analog converters.

We claim:

1. A two's complement digital to analog converter that converts a two's complement binary value to an analog output current, wherein the two's complement binary value has a most significant bit (MSB) and a set of value bits comprising:

a control circuit, coupled to the set of value bits, which generates controlled value bits having a binary value;

a digital to analog current converter (DACC), coupled to the control circuit, which generates a DACC analog current which is a portion of the analog output current and which has an absolute value which is related to the binary value of the controlled value bits; and an augmenter, coupled to the MSB and to the DACC, which generates a portion of the analog output current by modifying the absolute value of the DACC analog current by a least significant bit (LSB) current increment when the MSB indicates a negative value, wherein the control circuit generates the controlled value bits without inversion when the MSB indicates the negative value and generates the controlled value bits with all one values when the MSB indicates a positive value, and wherein the DACC is an inverting DACC, and wherein the augmenter modifies the DACC analog current by increasing the absolute value of the DACC analog current by the LSB current increment when the MSB indicates the negative value, and wherein the augmenter generates no signal when the MSB indicates the positive value.

2. The two's complement digital to analog converter according to claim 1, further comprising a non-inverting DACC, coupled to the control circuit, and wherein the control circuit generates, without inversion, positive value bits when the MSB indicates the positive value and generates the positive value bits with all zero values when the MSB indicates the negative value, and wherein the augmenter generates no signal when the MSB indicates the positive value.

3. The two's complement digital to analog converter according to claim 2, wherein the non-inverting DACC generates a non-inverting DACC analog current having an absolute value directly proportional to a binary value of the positive value bits by a factor which is the least significant bit current increment.

4. The two's complement digital to analog converter according to claim 1, wherein the DACC generates the DACC analog current as a negative current with the absolute value directly proportional to a binary value of a bitwise inversion of the controlled value bits by a factor which is the least significant bit current increment.

5. The two's complement digital to analog converter according to claim 1, wherein the augmenter comprises essentially a least significant bit (LSB) source and an enablement switch.

6. A two's complement digital to analog converter that converts a two's complement binary value to an analog output current, wherein the two's complement binary value has a most significant bit (MSB) and a set of value bits, comprising:

a control circuit, coupled to the set of value bits, which generates controlled value bits having a binary value;

a digital to analog current converter (DACC), coupled to the control circuit, which generates a DACC analog current which is a portion of the analog output current and which has an absolute value which is related to the binary value of the controlled value bits; and an augmenter, coupled to the MSB and to the DACC, which generates a portion of the analog output current by modifying the absolute value of the DACC analog current by a least significant bit (LSB) current increment when the MSB indicates a negative value, wherein the DACC is a non-inverting DACC, and wherein the control circuit generates the controlled value bits without inversion when the MSB indicates a positive value and generates the controlled value bits with bitwise inversion when the MSB indicates the negative value.

7. The two's complement digital to analog converter according to claim 6, wherein the DACC generates the DACC analog current with the absolute value directly proportional to the binary value of the controlled value bits by a factor which is the least significant bit current increment.

8. The two's complement digital to analog converter according to claim 6, further comprising a source/sink analog switch for inverting the DACC analog current when the MSB indicates a negative value.

9. A radio capable of reducing electromagnetic interference, comprising:

a receiver section that receives a radio signal and generates a demodulated signal therefrom;

a processing section, coupled to said receiver section, that decodes a message from the demodulated signal, wherein the processing section comprises a two's complement digital to analog converter that converts a two's complement binary value to an analog output current, wherein the two's complement binary value has a most significant bit (MSB) and a set of value bits, wherein the two's complement digital to analog converter comprises a control circuit, coupled to the set of value bits, which generates controlled value bits having a binary value;

a digital to analog current converter (DACC), coupled to the control circuit, which generates a DACC analog current which is a portion of the analog output current and which has an absolute value which is related to the binary value of the controlled value bits; and an augmenter, coupled to the MSB and to the DACC, which generates a portion of the analog output current by modifying the absolute value of the DACC analog current by a least significant bit (LSB) current increment when the MSB indicates a negative value; and an alert device, coupled to said processing section, for generating an alert when the message is received, wherein the control circuit generates the controlled value bits without inversion when the MSB indicates the negative value and generates the controlled value bits with all one values when the MSB indicates a positive value, and wherein the DACC is an inverting DACC, and wherein the augmenter modifies the DACC analog current by increasing the absolute value of the DACC analog current by the LSB current increment when the MSB indicates the negative value, and wherein the augmenter generates no signal when the MSB indicates the positive value.

10. The radio according to claim 9, further comprising a non-inverting DACC, coupled to the control circuit, and wherein the control circuit generates, without inversion, positive value bits when the MSB indicates the positive value and generates the positive value bits with all zero values when the MSB indicates the negative value, and wherein the augmenter generates no signal when the MSB indicates the positive value.

11. The radio according to claim 10, wherein the non-inverting DACC generates a non-inverting DACC analog current having an absolute value directly proportional to a binary value of the positive value bits by a factor which is the least significant bit current increment.

12. The radio according to claim 9, wherein the DACC generates the DACC analog current as a negative current with the absolute value directly proportional to a binary value of a bitwise inversion of the controlled value bits by a factor which is the least significant bit current increment.

13. The radio according to claim 9, wherein the augmenter comprises essentially a least significant bit (LSB) source and an enablement switch.

14. A radio capable of reducing electromagnetic interference, comprising:

a receiver section that receives a radio signal and generates a demodulated signal therefrom;

a processing section, coupled to said receiver section, that decodes a message from the demodulated signal, wherein the processing section comprises a two's complement digital to analog converter that converts a two's complement binary value to an analog output current, wherein the two's complement binary value has a most significant bit (MSB) and a set of value bits, wherein the two's complement digital to analog converter comprises a control circuit, coupled to the set of value bits, which generates controlled value bits having a binary value;

a digital to analog current converter (DACC), coupled to the control circuit, which generates a DACC analog current which is a portion of the analog output current and which has an absolute value which is related to the binary value of the controlled value bits; and an augmenter, coupled to the MSB and to the DACC, which generates a portion of the analog output current by modifying the absolute value of the DACC analog current by a least significant bit (LSB) current increment when the MSB indicates a negative value; and an alert device, coupled to said processing section, for generating an alert when the message is received, wherein the DACC is a non-inverting DACC, and wherein the control circuit generates the controlled value bits without inversion when the MSB indicates a positive value and generates the controlled value bits with bitwise inversion when the MSB indicates the negative value.

15. The radio according to claim 14, wherein the DACC generates the DACC analog current with the absolute value directly proportional to the binary value of the controlled value bits by a factor which is the least significant bit current increment.

16. The radio according to claim 14, further comprising a source/sink analog switch for inverting the DACC analog current when the MSB indicates a negative value.

* * * * *